United States Patent [19]

Todt et al.

[11] Patent Number: 5,549,748

[45] Date of Patent: Aug. 27, 1996

[54] METHOD FOR HARVESTING SINGLE CRYSTALS FROM A PERITECTIC MELT

[75] Inventors: Volker R. Todt, Lemont, Ill.; Suvankar Sengupta, Columbus; Donglu Shi, Cincinnati, both of Ohio

[73] Assignee: University of Chicago, Chicago, Ill.

[21] Appl. No.: 372,042

[22] Filed: Jan. 12, 1995

[51] Int. Cl.⁶ ................................................. C30B 19/04
[52] U.S. Cl. ................................ 117/53; 117/40; 117/925
[58] Field of Search .................................. 117/36, 40, 41, 117/53, 64, 925; 423/593; 505/126, 742

[56] References Cited

U.S. PATENT DOCUMENTS

| | | | |
|---|---|---|---|
| 5,116,808 | 5/1992 | Belouet | 505/1 |
| 5,231,076 | 7/1993 | Jeong et al. | 505/126 |
| 5,306,697 | 4/1994 | Salama et al. | 505/126 |

Primary Examiner—Felisa C. Garrett
Attorney, Agent, or Firm—Reinhart, Boerner, Van Deuren, Norris & Rieselbach, s.c.

[57] ABSTRACT

A method of preparing single crystals. The method of preparation involves preparing precursor materials of a particular composition, heating the precursor material to achieve a peritectic mixture of peritectic liquid and crystals, cooling the peritectic mixture to quench directly the mixture on a porous, wettable inert substrate to wick off the peritectic liquid, leaving single crystals on the porous substrate. Alternatively, the peritectic mixture can be cooled to a solid mass and reheated on a porous, inert substrate to melt the matrix of peritectic fluid while leaving the crystals unmelted, allowing the wicking away of the peritectic liquid.

18 Claims, 2 Drawing Sheets

METHOD FOR HARVESTING SINGLE CRYSTALS FROM A PERITECTIC MELT

This invention was made with Government support under Contract No. W-31-109-ENG-38 awarded by the Department of Energy, and the U.S. Government has certain rights in this invention.

The present invention is concerned generally with a method of producing single crystals. More particularly, the invention is concerned with a method of harvesting single crystals from a peritectic flux melt by wicking away, or desorbtion, of the melt and collecting the solid single crystals on an inert substrate.

A multitude of crystal growing methods exist but typically involve slow, low volume techniques. Frequently there is need for producing large numbers of seed crystals to be used in growing much larger single crystals. Moreover, it would be helpful to produce such crystals in large numbers rapidly with simple equipment.

It is therefore an object of the invention to provide an improved method of manufacture of seed crystals.

It is another object of the invention to provide a novel method of collecting single crystals by forming a liquid/solid mixture and removing the liquid, leaving solid seed crystals behind.

It is a further object of the invention to provide an improved method of collecting single crystals from a liquid by absorbtion of the unwanted liquid by an inert, porous substrate.

It is also an object of the invention to provide a novel method of producing single crystals by heating a solid mass to a temperature sufficient to form a flux melt removable by absorbtion.

It is an additional object of the invention to provide an improved method of collecting single crystals by forming a mixture of single crystals and equilibrium liquid phase over an inert, porous substrate which absorbs the equilibrium liquid phase.

It is yet another object of the invention to provide a novel method of collecting seed crystals by removal of a liquid phase surrounding the crystals by capillary desorbtion.

Other objects and advantages will become apparent from the detailed description and drawings described hereinbelow.

DETAILED DESCRIPTION OF PREFERRED EMBODIMENTS

Figure 1:
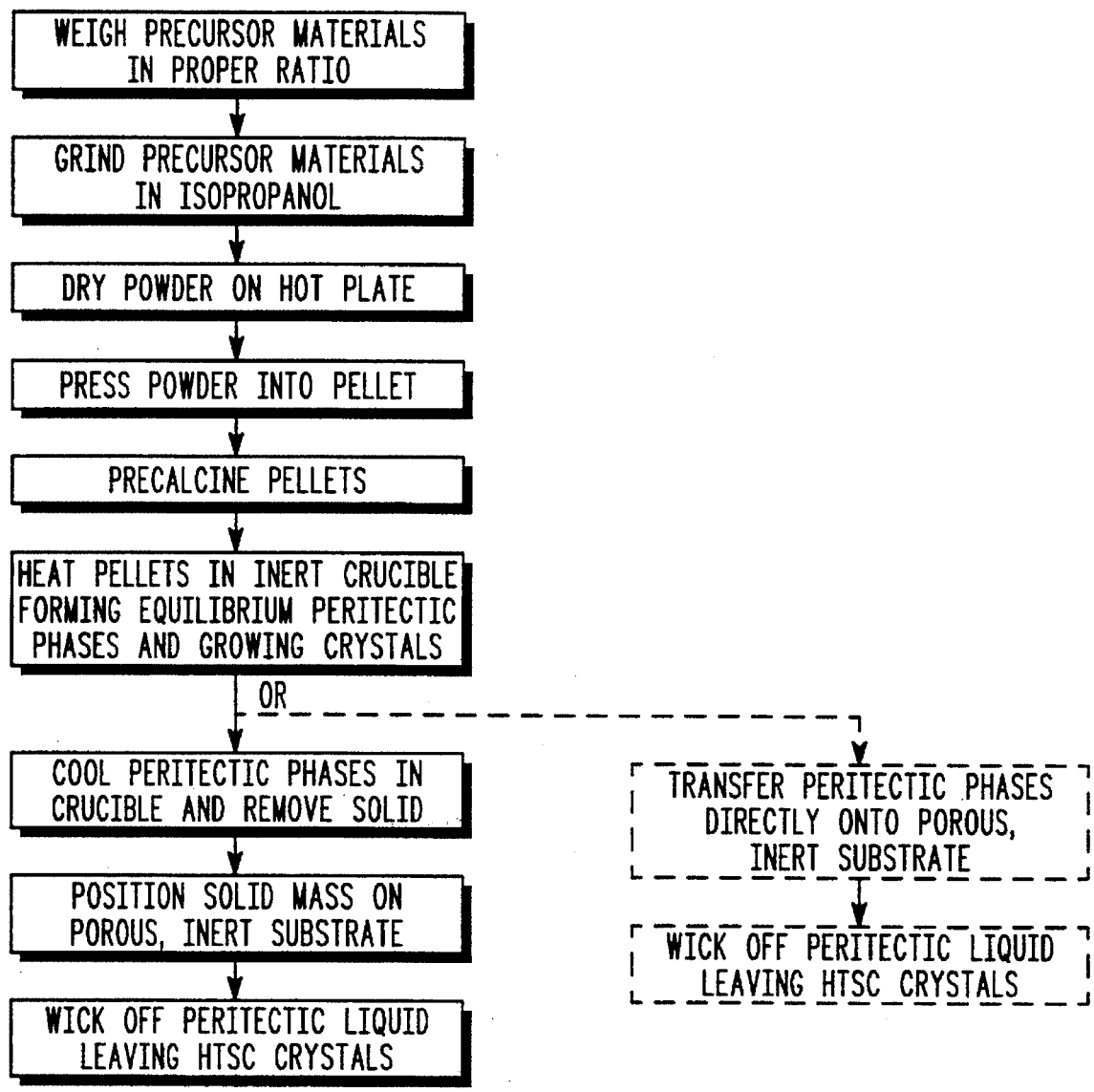
FIG. 1 sets forth a flow diagram illustrating a preferred method of the invention.

A method of the invention is described generally by reference to the flow diagram of FIG. 1. The method of the invention can generally be used in any phase system which exhibits a peritectic phase diagram. One example of use of the method of the invention is a high temperature superconductor (HTSC). Given such a system, one proceeds by procuring the starting chemicals, elemental or compounded, and weighing out the appropriate amounts to achieve the desired composition. Alternatively, the precursor material can be an already compounded material adequate to achieve the desired result upon heating to attain the peritectic equilibrium mixture described hereinafter. Ideally the precursor material is such that one achieves optimum growth conditions for the desired seed crystals. It is also preferable to minimize the amount of liquid used to suspend the crystals for growth, but not such a small amount as to cause the crystals to form together, which would defeat the objective of obtaining isolated single crystals. The end morphology of crystals can also be modified in a conventional manner by changing the composition. As is known in the crystal growing art, the kinetics of growth vary within such a peritectic phase region; and as explained for Example II, one can, for example in an HTSC system, adjust the crystal growth conditions to change from a flat-shaped crystal to cubic-shaped crystal morphology, depending primarily on the compositional location in the peritectic phase region. Such parameters as composition, temperature and quenching conditions can thus be readily adjusted by one of skill in the art to obtain the desired particular crystal morphology, as well as the number and size of seed crystals obtained.

Referring again to FIG. 1 the selected precursor material amounts are ground up in preparation for compounding. A typical method uses ball mill grinding of the materials in isopropanol (or other such inert liquid) for 4–12 hours. The resulting ground powder materials are dried, such as by a conventional furnace or hot plate; and then the powder materials are pressed into pellets. These pressed pellets are precalcined in the conventional manner in preparation for heating to the desired position of the phase diagram in the peritectic phase region.

Figure 2:
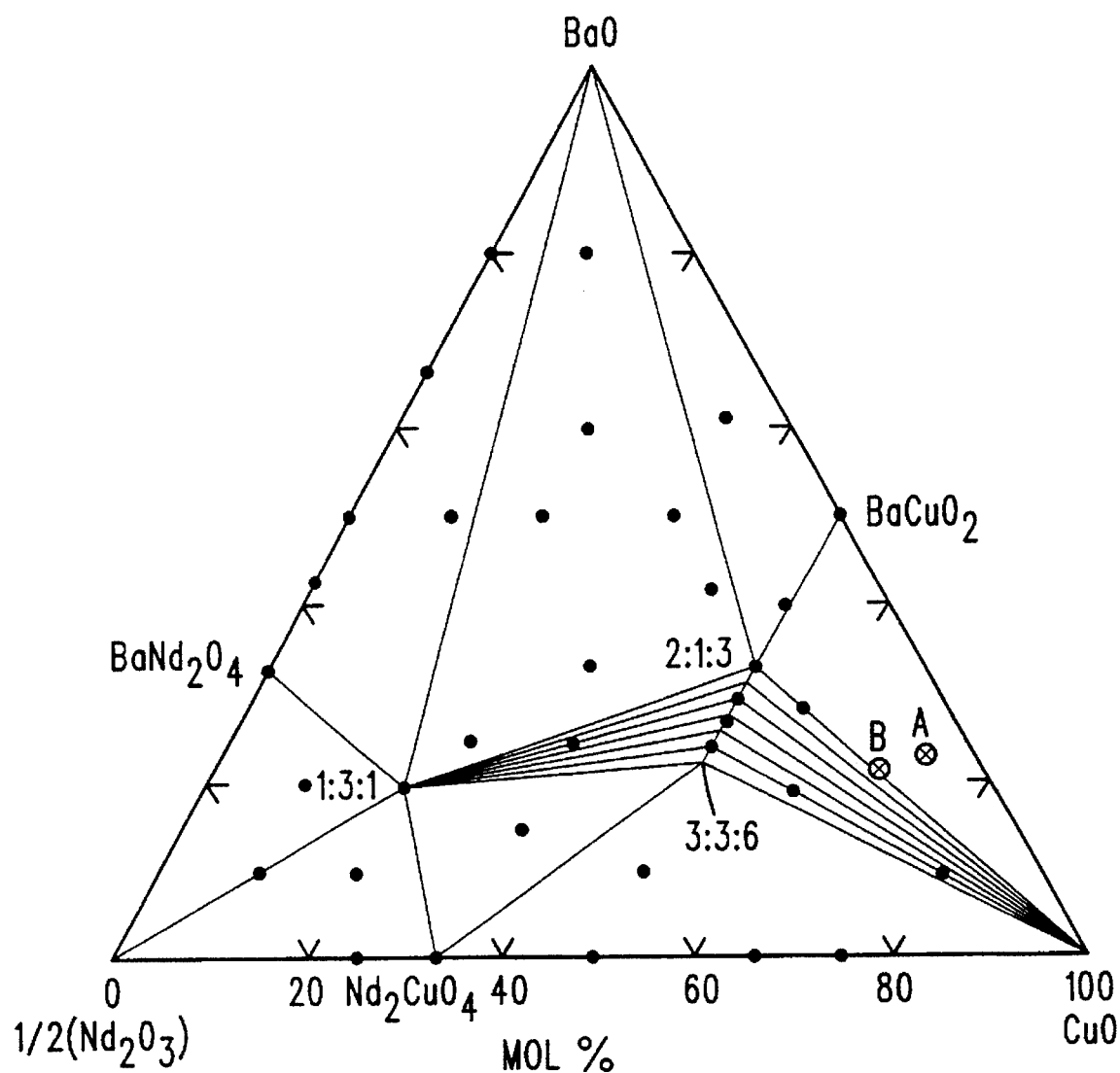
FIG. 2 is a pseudo ternary phase diagram of $Nd_2O_3$, BaO and CuO showing two exemplary compositions of the invention.

A substrate must also be prepared for the purpose of receiving the peritectic liquid plus crystal mixture. This substrate has the properties of being inert to the peritectic liquid to be wicked away, and also has a melting point above the melting temperature of the peritectic liquid phase. Such substrates are prepared to be wettable by the liquid and also to exhibit porosity, thereby enabling the absorbtion, or wicking away by the substrate, of the peritectic liquid from the mixture containing the seed crystals. For example, substrates can be prepared of a porous pellet, with melting point higher than the desired single crystals (See FIG. 2). For example, such solid materials as $Y_2BaCuO_x$ (211 YBaCu Oxide) can be used for the 123 Nd (or Sm) BaCu oxide systems. For the $Y_2BaCuO_x$ system, the pellets are sintered at about 30% below the melting point for 8–48 hours.

In the next step the precalcined pellets of the precursor material are placed in an inert crucible, such as $Al_2O_3$, a noble metal or other material nonreactive with the peritectic mixture. This crucible and precursor material are heated to a temperature for a time adequate to insure formation substantially of the equilibrium phases in the peritectic phase diagram. The heating protocol (and gas atmosphere conditions) can follow a wide variety of conventional thermodynamic paths but should result in achieving the prescribed equilibrium phase state needed in order to wick away, or desorbed, the peritectic liquid flux, leaving behind the seed crystals.

Upon achieving the desired equilibrium phase mixture, the seed crystals are allowed to grow to achieve the particular size and number by controlling the crystal growth conditions in a well-known, conventional manner. The contents of the crucible then can be processed in one of two preferred ways: (1) directly depositing the seed crystal/peritectic liquid mixture onto the above described porous substrate or (2) quenching the peritectic liquid/seed crystal mixture to form a solid mass, depositing the solid mass onto the porous substrate, and heating the mass sufficiently to melt only the solid matrix originally formed from the peritectic liquid, and wicking off, or desorbing that liquid. After removing the unwanted peritectic liquid (flux), one can physically remove the remaining seed crystals left sitting on the porous substrate.

The following nonlimiting Examples illustrate various illustrations of the method of the invention.

EXAMPLE I

A method of harvesting $Nd_{1+x}Ba_{2-x}Cu_3O_y$ crystals includes the following steps: (1) reagant grade $Nd_2O_3$, CuO and $BaCO_3$ are weighed in the composition ratio of 1:10:4 (mole percent), (2) these starting precursor materials are ball milled in a polyethylene bottle with a zirconia milling media in ethanol or isopropanol for 4–12 hours to achieve a homogeneous mixture of starting materials, (3) the powdered starting materials are dried on a hot plate under a $N_2$ atmosphere to avoid reactions of the starting powder with ambient atmosphere, (4) the dried powders are pressed into a pellet to reduce contact of the pellet with the alumina crucible to be used to melt the precursor materials; typical pellet diameters are 20 mm diameter, have a mass of 20 g and are pelletized using a pressure of 5,000–10,000 Pa, (5) the pellets are presintered at 940° C. for a least 24 hours, (6) are then heated to about 1050° C.–1100° C. and held for about 48 hours, (7) the heated mixture is cooled slowly (about 1° to 10° C. an hour) to about 1000° C. to promote crystal growth in the peritectic liquid (flux), (8) the crucible containing the specimen is quenched onto a copper block to form solid mass, stopping crystal growth, (9) place solid mass present in the crucible onto a porous $Y_2BaCuO_x$ substrate, (10) heat the solid mass to about 1050° C., hold for 2–8 hours allowing peritectic liquid (flux) to be absorbed, or wicked away, into the porous structure by gravitation and capillary forces, (11) the remaining crystals are cooled to room temperature and (12) the seed crystals are removed from the porous substrate.

EXAMPLE II

In the $Nd_2O_3$/CuO/BaO system (See FIG. 2) single crystals were prepared of different morphologies by adjusting composition within the peritectic phase region. ½($Nd_2O_3$), BaO and CuO were mixed in the following two ratios: 1:4:12.5 and 1:2:6.25. Each of these compositions were heated to a temperature of 950° C. and held for 48 hours. At the end of that time the peritectic mixture was processed in the same manner as Example I to collect the crystals. In the case of the ratio being 1:4:12.5, the crystals had a flat morphology. In the case of the ratio being 1:2:6.25, the morphology was cube shaped for the crystals.

Further advantages and features of the invention will be appreciated by reference to the claims set forth hereinafter. While preferred embodiments have been described, it will be clear to those of ordinary skill in the art that changes and modifications can be made without departing from the spirit and scope of the invention in its fullest aspects.

What is claimed is:

1. A method of preparing single crystals, comprising the steps of:

preparing a precursor material having a selected composition;

heating said precursor material and achieving a peritectic mixture of phases including a peritectic liquid and crystals;

positioning near said peritectic mixture a substrate having a porosity and being inert to said peritectic mixture;

quenching said peritectic mixture on said substrate;

desorbing said peritectic liquid using said substrate, leaving said single crystals behind on said substrate; and removing said single crystals from said substrate.

2. The method as defined in claim 1 wherein said precursor material comprises a mixture of compounds.

3. The method as defined in claim 1 wherein said single crystals have a composition selected from the group consisting of 123 NdBaCu oxide, 123 SmBaCu oxide and 123 YBaCu oxide.

4. The method as defined in claim 1 wherein said step of heating comprises the steps of heating to a peritectic phase region, forming said crystals and growing said crystals.

5. The method as defined in claim 4 wherein said step of growing said crystals comprises slowly cooling said peritectic mixture.

6. The method as defined in claim 1 wherein said step of heating includes placing said precursor material in an inert crucible.

7. The method as defined in claim 1 wherein said precursor material is heated in an inert crucible which is selected from the group consisting of alumina, a noble metal and zirconia.

8. The method as defined in claim 1 further including the step of using adjusted compositions for said precursor material for forming different morphologies for said crystals including a flat shaped crystal and a cubic shaped crystal.

9. The method as defined in claim 1 further including the step of adjusting crystal growing conditions for forming different morphologies for said crystals including a flat shaped crystal and a cubic shaped crystal.

10. A method of preparing single crystals, comprising the steps of:

preparing a precursor material having a selected composition;

heating said precursor material in a crucible and achieving a peritectic equilibrium mixture of phases including a peritectic liquid and crystals;

cooling said peritectic equilibrium mixture in said crucible to form a solid mass in said crucible;

removing said solid mass from said crucible;

positioning a substrate having a porosity and being inert to said peritectic equilibrium mixture and placing said solid mass on said substrate;

desorbing said peritectic liquid using said substrate, leaving behind crystals on said substrate; and removing said crystals from said substrate.

11. The method as defined in claim 10 wherein said step of preparing precursor material comprises preparing a mixture of materials which collectively correspond to said selected composition.

12. The method as defined in claim 11 wherein said crystals comprise 123 Nd Ba Cu oxide and said precursor material consists essentially of $Nd_2O_3$, CuO and $BaCO_3$ in the mole percent ratio of 1:10:4.

13. The method as defined in claim 10 wherein said single crystal is selected from the group consisting of 123 NdBaCu oxide, 123 SmBaCu oxide and 123 YBaCu oxide.

14. The method as defined in claim 10 wherein said step of heating said precursor material comprises heating to a peritectic phase region and forming and growing said crystals.

15. The method as defined in claim 14 wherein said step of growing said crystals includes slowly cooling said mixture of peritectic liquid and crystals at least through said peritectic phase region.

16. The method as defined in claim 10 wherein said crucible consists essentially of a material inert to said peritectic liquid and crystals.

17. The method as defined in claim 10 wherein said substrate comprises a material inert to said peritectic liquid and crystals.

18. The method as defined in claim 17 wherein said substrate comprises a compound having a higher melting point than said single crystals.

* * * * *